(12) United States Patent
Akagawa et al.

(10) Patent No.: US 10,274,667 B2
(45) Date of Patent: Apr. 30, 2019

(54) LIGHT-EMITTING DEVICE WITH TWO GREEN LIGHT-EMITTING ELEMENTS WITH DIFFERENT PEAK WAVELENGTHS AND BACKLIGHT INCLUDING LIGHT-EMITTING DEVICE

(71) Applicant: NICHIA CORPORATION, Anan-shi, Tokushima (JP)

(72) Inventors: Seitaro Akagawa, Komatsushima (JP); Takeshi Morikawa, Tokushima (JP); Yusaku Achi, Tokushima (JP); Kentaro Nishigaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 198 days.

(21) Appl. No.: 15/407,377

(22) Filed: Jan. 17, 2017

(65) Prior Publication Data
US 2017/0205565 A1    Jul. 20, 2017

(30) Foreign Application Priority Data
Jan. 18, 2016  (JP) ................. 2016-007484

(51) Int. Cl.
*F21V 8/00* (2006.01)
*H01L 25/10* (2006.01)
(Continued)

(52) U.S. Cl.
CPC ......... *G02B 6/0073* (2013.01); *G02B 6/0068* (2013.01); *H01L 25/0753* (2013.01);
(Continued)

(58) Field of Classification Search
CPC . G02B 6/0068; G02B 6/0073; H01L 25/0753; H01L 25/105; H01L 27/156; H01L 33/50
See application file for complete search history.

(56) References Cited

U.S. PATENT DOCUMENTS 7,759,683 B2 * 7/2010 Lee ..................... H01L 25/0753
257/100
2007/0001188 A1 * 1/2007 Lee ..................... H01L 25/0753
257/99
(Continued)

FOREIGN PATENT DOCUMENTS

JP    08-272316 A    10/1996
JP    09-016105 A    1/1997
(Continued)

*Primary Examiner* — Anh T Mai
*Assistant Examiner* — Michael Chiang
(74) *Attorney, Agent, or Firm* — Global IP Counselors, LLP

(57) ABSTRACT

A light-emitting device includes: one or more first light-emitting elements each having a peak wavelength in a range from 430 nm to less than 490 nm; a second light-emitting element having a peak wavelength Y in a range from 490 nm to less than a wavelength X; a third light-emitting element having a peak wavelength Z in a range from more than the wavelength X to 570 nm; and a phosphor or a fourth light-emitting element having a peak wavelength in a range from 580 nm to 680 nm. At least one of the second and third light-emitting elements is connected to at least one of the first light-emitting elements in series. The wavelength X is in a range from more than 490 nm to less than 570 nm with an absolute value of difference between |X−Y| and |X−Z| being 10 nm or less.

7 Claims, 6 Drawing Sheets

(51) Int. Cl.
    *H01L 27/15* (2006.01)
    *H01L 33/50* (2010.01)
    *H01L 25/075* (2006.01)
(52) U.S. Cl.
    CPC .......... *H01L 25/105* (2013.01); *H01L 27/156* (2013.01); *H01L 33/50* (2013.01); *G02B 6/0083* (2013.01); *H01L 2224/16245* (2013.01); *H01L 2224/48137* (2013.01)

(56) References Cited

U.S. PATENT DOCUMENTS

| | | | |
|---|---|---|---|
| 2007/0126011 A1 | 6/2007 | Lee | |
| 2008/0061674 A1* | 3/2008 | Chen | C09K 11/643 313/485 |
| 2008/0298053 A1* | 12/2008 | Van Gorkom | G02B 6/0068 362/231 |
| 2010/0066943 A1* | 3/2010 | Akiba | G02B 6/0068 349/62 |
| 2010/0244061 A1 | 9/2010 | Shirakawa et al. | |
| 2012/0230024 A1 | 9/2012 | Moore | |
| 2012/0314451 A1* | 12/2012 | Matsuura | G02B 6/0068 362/613 |
| 2015/0016104 A1 | 1/2015 | Wu | |
| 2015/0106660 A1 | 4/2015 | Chumbalkar et al. | |
| 2015/0155460 A1* | 6/2015 | Fukasawa | H01L 33/08 257/89 |
| 2015/0184811 A1 | 7/2015 | Moore | |
| 2016/0149088 A1* | 5/2016 | Yan | H01L 25/0753 257/48 |
| 2016/0360956 A1 | 12/2016 | Moore | |
| 2017/0047311 A1* | 2/2017 | Kondoh | H01L 33/62 |

FOREIGN PATENT DOCUMENTS

| | | |
|---|---|---|
| JP | H10-247748 A | 9/1998 |
| JP | 2007-158296 A | 6/2007 |
| JP | 2008-134318 A | 6/2008 |
| JP | 2010-129923 A | 6/2010 |
| JP | 2010-218991 A | 9/2010 |
| JP | 2010-231938 A | 10/2010 |
| JP | 2013-115079 A | 6/2013 |
| JP | 2014-514685 A | 6/2014 |
| JP | 2015-019068 A | 1/2015 |
| JP | 2015-106660 A | 6/2015 |
| WO | 2012-120380 A1 | 9/2012 |
| WO | 2015-182272 A1 | 12/2015 |

* cited by examiner

LIGHT-EMITTING DEVICE WITH TWO GREEN LIGHT-EMITTING ELEMENTS WITH DIFFERENT PEAK WAVELENGTHS AND BACKLIGHT INCLUDING LIGHT-EMITTING DEVICE

CROSS-REFERENCE TO RELATED APPLICATION

This application claims priority to Japanese Patent Application No. 2016-007484, filed on Jan. 18, 2016, the disclosure of which is hereby incorporated by reference in its entirety.

BACKGROUND

1. Field of the Invention

The present disclosure relates to a light-emitting device and a backlight including the light-emitting device.

2. Description of Related Art

Generally, light-emitting devices including light-emitting elements such as light-emitting diodes (LEDs) are widely used as various light sources for apparatuses such as backlights of liquid-crystal displays, LED bulbs or LED fluorescent lights, and lighting apparatuses including ceiling lights.

For example, light-emitting devices disclosed in Japanese Unexamined Patent Application Publication No. 2007-158296 include red phosphors, light-emitting elements that emit blue light, and light-emitting elements that emit green light. This constitution is described as light-emitting devices with high color reproducibility used for backlights for liquid-crystal displays.

SUMMARY

A light-emitting device according to an embodiment includes one or more first light-emitting elements, a second light-emitting element, a third light-emitting element, and a phosphor or a fourth light-emitting element. Each of the first light-emitting elements has a peak wavelength in a range from 430 nm to less than 490 nm. The second light-emitting element has a peak wavelength Y in a range from 490 nm to less than a wavelength X. The third lightemitting element has a peak wavelength Z in a range from more than the wavelength X to 570 nm. The phosphor or the fourth light-emitting element has a peak wavelength in a range from 580 nm to 680 nm. At least one of the second light-emitting element and the third light-emitting element is connected to at least one of the first light-emitting elements in series. The wavelength X is in a range from more than 490 nm to less than 570 nm with an absolute value of difference between |X−Y| and |X−Z| being 10 nm or less.

DETAILED DESCRIPTION OF EMBODIMENTS

Figure 1A:
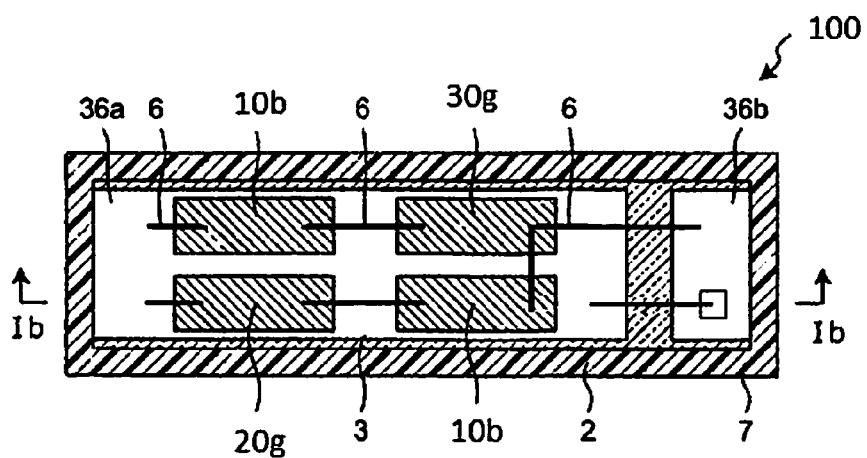
FIG. 1A is a schematic top view of a light-emitting device 100 according to a first embodiment.

The following describes embodiments of the present invention in detail on the basis of the accompanying drawings. The descriptions below include terms indicating specific directions or positions (for example, "up", "down", and other terms containing the meanings of these terms) as appropriate. Use of these terms is, however, intended to facilitate understanding of the invention referring to the drawings, and the meanings of these terms do not limit the technical scope of the present invention. A portion with the same reference number represents the same or equivalent portion or member in a plurality of drawings.

The embodiments below exemplify light-emitting devices embodying the technical concept of the present invention and are not intended to limit the present invention to the constitutions below. Unless specifically stated otherwise, sizes, materials, shapes, and relative positions of constituent components described in the embodiments do not limit the scope of the present invention to the aforementioned descriptions only but are intended to exemplify the scope of the present invention. There is a case where magnitudes or positional relations of members illustrated in each drawing are exaggerated so as to facilitate understanding. Standards according to JIS Z8110 are applied to the relations between color names and chromaticity coordinates, the relations between wavelength ranges of light and color names of monochromatic lights, and the like.

However, the light-emitting elements that emit green light (hereinafter referred to as green light-emitting elements) contain more indium than the light-emitting elements that emit blue light, resulting, therefore, even when a plurality of green light-emitting elements are manufactured by the same procedure, wavelengths from the resulting light-emitting elements might vary greatly. Accordingly, when the light-emitting devices disclosed in Japanese Unexamined Patent Application Publication No. 2007-158296 are produced using only green light-emitting elements having desired wavelengths, yield of the light-emitting devices may be extremely poor.

In view of the above, certain embodiments of the present disclosure have an object to provide a light-emitting device with an improved yield.

A light-emitting device according to certain embodiments of the present disclosure includes a first light-emitting element (i.e., blue light-emitting element) that emits light having a peak wavelength in a range of 430 nm to less than 490 nm, and second and third light-emitting elements (i.e., green light-emitting elements) that emit light having peak wavelengths in a range of 490 nm to 570 nm. The light-emitting device also includes a phosphor or a fourth light-emitting element (red light-emitting element) that emits light having a peak wavelength in a range of 580 nm to 680 nm.

Based on a wavelength X nm in a range of more than 490 nm to less than 570 nm, the peak wavelength Y nm of the second light-emitting element is in a range of 490 nm to less than the wavelength X nm, and the peak wavelength Z nm of the third light-emitting element is in a range of more than the wavelength X nm to 570 nm. The absolute value of difference between |X−Y| and |X−Z| is equal to or less than 10 nm.

The light-emitting device according to certain embodiments of the present disclosure having such a constitution can achieve good color reproducibility. In addition, use of at least two green light-emitting elements having a specific relation can achieve a desired color range at lower cost than in the case of a light-emitting device including only one green light-emitting element.

The following describes light-emitting devices according to embodiments of the present invention in detail.

1. First Embodiment

Figure 1B:
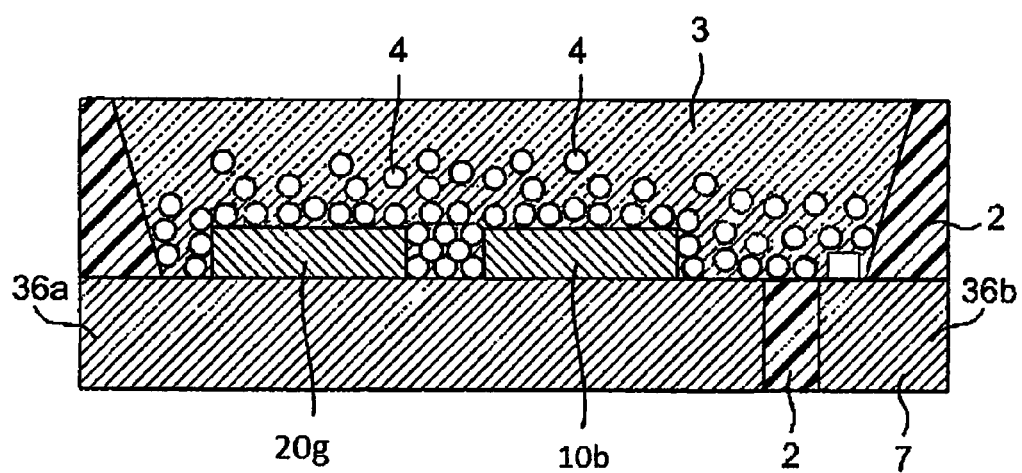
FIG. 1B is a schematic cross-sectional view along the line Ib-Ib in FIG. 1A.

FIG. 1A is a schematic perspective view of a light-emitting device 100. FIG. 1B is a schematic cross-sectional view along the line Ib-Ib in FIG. 1A. In FIG. 1A, illustration of a phosphor 4 is omitted to facilitate identification of first light-emitting elements 10b, a second light-emitting element 20g, and a third light-emitting element 30g in a light-transmissive member 3.

The light-emitting device 100 includes at least one blue light-emitting element (i.e., first light-emitting element 10b) on an upper surface of a first lead 36a disposed on a bottom surface of a cavity of a resin package 2. In the embodiment shown in FIG. 1A and FIG. 1B, two first light-emitting elements 10b are mounted on the upper surface of the first lead 36a. The light-emitting device 100 includes at least two green light-emitting elements (i.e., the second light-emitting element 20g and the third light-emitting element 30g) on an upper surface of a second lead 36b disposed on the bottom surface of the cavity of the resin package 2.

Figure 2:
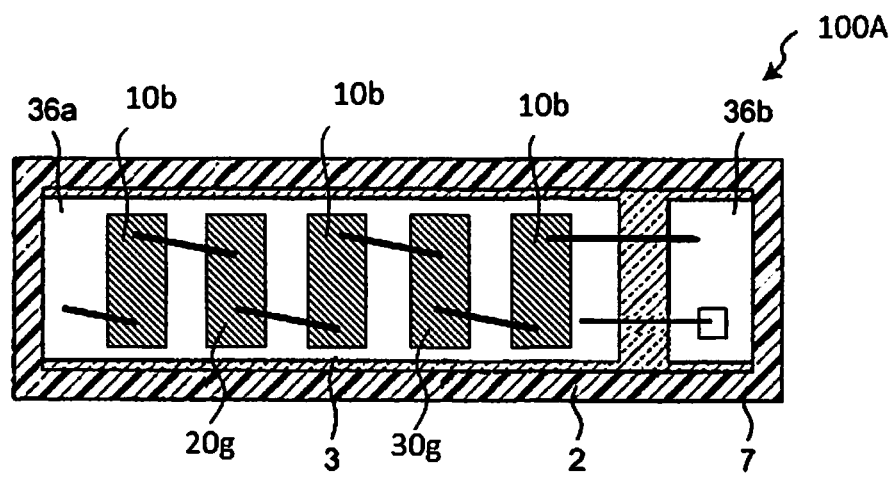
FIG. 2 is a schematic top view of a light-emitting device 100A according to a modification of the light-emitting device 100.

Depending on the desired quantity of light or the like, the light-emitting device 100 may include two or more blue light-emitting elements and may include three or more green light-emitting elements. In the embodiment shown in FIG. 1A, the number of blue light-emitting elements is the same as the number of green light-emitting elements, but the numbers can be appropriately determined. For example, as shown in FIG. 2, the number of blue light-emitting elements may differ from the number of green light-emitting elements. Depending on the desired emission properties, the number of blue light-emitting elements may be larger than the number of green light-emitting elements, or the number of green light-emitting elements may be larger than the number of blue light-emitting elements.

In the embodiment shown in FIG. 1A, the second light-emitting element 20g and one first light-emitting element 10b are aligned in the bottom row starting from the left, and the other first light-emitting element 10b and the third light-emitting element 30g are aligned in the second row from the bottom starting from the left.

The peak wavelength of the first light-emitting elements 10b is in a range of 430 nm to less than 490 nm (i.e., wavelength range in the blue region), preferably in a range of 440 nm to 470 nm. The peak wavelengths of the second light-emitting element 20g and the third light-emitting element 30g are in a range of 490 nm to 570 nm (i.e., wavelength range in the green region), preferably in a range of 520 nm to 550 nm.

For example, the first light-emitting elements 10b, the second light-emitting element 20g, and the third light-emitting element 30g are each electrically connected to an external circuit such as a wiring layer of a mounting board, and emit light using electricity supplied via the external circuit. In the embodiment of the light-emitting device 100 shown in FIG. 1A, regarding the second light-emitting element 20g and the first light-emitting element 10b in the bottom row, one of positive and negative electrodes of the second light-emitting element 20g is connected to the first lead 36a via a wire 6, and the other one of the positive and negative electrodes of the second light-emitting element 20g is connected to one of positive and negative electrodes of the first light-emitting element 10b in the bottom row via another wire 6.

Regarding the first light-emitting element 10b and the third light-emitting element 30g in the second row from the bottom, one of positive and negative electrodes of the first light-emitting element 10b is connected to the first lead 36a via a wire 6, the other one of the positive and negative electrodes of the first light-emitting element 10b is connected to one of positive and negative electrodes of the third light-emitting element 30g via another wire 6, and the other one of the positive and negative electrodes of the third light-emitting element 30g is connected to the second lead 36b via still another wire 6. In the embodiment of the light-emitting device 100 shown in FIG. 1A, the first light-emitting element 10b in the bottom row is connected to the third light-emitting element 30g via a wire 6. This constitution enables each light-emitting element to be electrically connected to a support 7 stably even with little region in which the wires 6 extending from the light-emitting elements mounted on the first lead 36 are connected to the second lead 36b, when an electronic component such as a protective element is disposed on the support 7 (on the second lead 36b in FIG. 1A), for example as shown in FIG. 1A. In this light-emitting device according to the embodiment of the present disclosure, at least one of the second light-emitting element 20g and the third light-emitting element 30g is connected to the first light-emitting element(s) 10b in series.

In the light-emitting device 100, the support 7 is a term for a combination of the resin part, the first lead 36a, and the second lead 36b. The support herein is a member on which the first light-emitting elements 10b, the second light-emitting element 20g, and the third light-emitting element 30g are disposed. The support includes, for example, a base such as a resin package or a substrate, and an electrically-conductive member that is disposed on the surface of or within the base to supply electricity to the light-emitting elements. Examples of the electrically-conductive member include, for example, leads, via holes, and wiring layers.

In the embodiment of the light-emitting device 100 shown in FIG. 1A and FIG. 1B, the light-transmissive member 3 is disposed in the cavity of the resin package 2. The light-transmissive member 3 may be, for example, an encapsulation resin or glass. The light-transmissive member 3 contains the phosphor 4 having a peak wavelength in a range of 580 nm to 680 nm. The phosphor 4 absorbs part of blue light emitted from the first light-emitting elements 10b and emits red light. That is, the phosphor 4 converts the wavelength of the blue light into a wavelength of red light.

The light-emitting device according to certain embodiments of the present disclosure may include a fourth light-emitting element (i.e., red light-emitting element) that emits light having a peak wavelength in a range of 580 nm to 680 nm, instead of the phosphor 4. When the fourth lightemitting element is used, use of a light-emitting element having a full width at half maximum of 30 nm is preferable, and use of a light-emitting element having a full width at half maximum of 20 nm is more preferable. Use of such a fourth light-emitting element readily enables the red light having a sharp peak wavelength. Accordingly, a liquid-crystal display including the light-emitting device 100 can achieve high color reproducibility.

It is preferable that the phosphor 4 hardly absorb green light and hardly emit red light. That is, the phosphor 4 substantially does not convert the wavelength of green light into the wavelength of red light. The reflectance of the phosphor 4 with respect to green light is preferably 70% or more on average in the wavelength range of green light. Designing the light-emitting device can be facilitated by employing a phosphor having a high reflectance with respect to green light, that is, less likely to absorb green light, that is, less likely to convert the wavelength of green light, for the phosphor 4.

When a red phosphor having a high absorption with respect to green light is used, the light output balance of the light-emitting device is required to be determined in consideration of wavelength conversion by the phosphor 4 with respect to not only the first light-emitting elements 10b but the second light-emitting element 20g and the third light-emitting element 30g. On the other hand, when the phosphor 4 that hardly converts the wavelength of green light is used, the light output balance of the light-emitting device can be designed in consideration of only wavelength conversion of blue light emitted from the first light-emitting elements 10b.

Examples of the phosphor 4 having such preferable properties include the red phosphors below. The phosphor 4 is at least one of the following.

One type is red phosphors having compositions represented by the following general formula (I).

$$A_2MF_6:Mn^{4+} \quad (1)$$

In the general formula (I), A is at least one selected from the group consisting of K, Li, Na, Rb, Cs, and $NH^{4+}$, and M is at least one element selected from the group consisting of Group IV elements and Group XIV elements.

The Group IV elements include titanium (Ti), zirconium (Zr), and hafnium (Hf). The Group XIV elements include silicon (Si), germanium (Ge), tin (Sn), and lead (Pb).

Specific examples of the one type of red phosphors include $K_2SiF_6:Mn^{4+}$, $K_2(Si,Ge)F_6:Mn^{4+}$, and $K_2TiF_6:Mn^{4+}$.

The light-transmissive member 3 covers at least part of the first light-emitting elements 10b and at least part of each of the second light-emitting element 20g and the third light-emitting element 30g. At least part of the light-transmissive member 3 is located between the first light-emitting element 10b and the second light-emitting element 20g or between the first light-emitting element 10b and the third light-emitting element 30g. The light-transmissive member 3 is preferably disposed across the first light-emitting elements 10b, the second light-emitting element 20g, and the third light-emitting element 30g in contact with these elements. As shown in FIG. 1A and FIG. 1B, the entire surfaces except for the bottom surfaces, which are in contact with the first lead 36a or the second lead 36b, of the first light-emitting elements 10b (that is, an upper surface and lateral surfaces) may substantially be covered with the light-transmissive member 3. In the same manner, the entire surfaces except for the bottom surfaces, which are in contact with the first lead 36a or the second lead 36b, of the second light-emitting element 20g and the third light-emitting element 30g (that is, upper surfaces and lateral surfaces) may substantially be covered with the light-transmissive member 3.

By covering the first light-emitting elements 10b with the light-transmissive member 3, the phosphor 4 contained in the light-transmissive member 3 absorbs part of blue light emitted from the first light-emitting elements 10b, and emits red light. Blue light that has not been subjected to wavelength conversion by the phosphor 4, and the red light emitted from the phosphor 4 pass through the light-transmissive member 3 and exit to the outside through the upper surface (i.e., light extracting surface of the light-emitting device 100) of the light-transmissive member 3. On the other hand, green light emitted from the second light-emitting element 20g and the third light-emitting element 30g is partially converted by the phosphor 4 into red light, preferably not (or hardly) converted by the phosphor 4 into red light, passes through the light-transmissive member 3, and exits to the outside through the upper surface of the light-transmissive member 3. The blue light, the red light, and the green light are then mixed outside the light-transmissive member 3, and light of a desired color such as white can be obtained.

In the light-emitting device 100, green light is obtained by emission of light from at least two elements, which are the second light-emitting element 20g and the third light-emitting element 30g, having peak wavelengths in a range of 490 nm to 570 nm. Light-emitting elements having full width at half maximum 40 nm are preferably used as the second light-emitting element 20g and third light-emitting element 30g, and light-emitting elements having full width at half maximum 30 nm are more preferably used. This constitution enables the green light to have a sharp peak more easily than when green light is obtained using a green phosphor. Accordingly, a liquid-crystal display including the light-emitting device 100 can achieve high color reproducibility.

In addition, part of the green light emitted from the second light-emitting element 20g and the third light-emitting element 30g is preferably scattered by the phosphor 4 without change in its wavelength. In this case, the intensity distribution of green light outside the light-transmissive member 3 is uniform, and color non-uniformity can be reduced. In addition, for example, it is advantageous also in view of productivity for the light-transmissive member 3 to be made of the same resin covering the first light-emitting elements 10b as the resin covering the second light-emitting element 20g and the third light-emitting element 30g.

Based on a given wavelength X nm in a range of 490 nm to 570 nm, the peak wavelength Y nm of the second light-emitting element 20g is in a range of 490 nm to less than the wavelength X nm, and the peak wavelength Z nm of the third light-emitting element 30g is in a range of more than the wavelength X nm to 570 nm. The absolute value of difference between |X−Y| and |X−Z| is equal to or less than 10 nm. The wavelength X is preferably in a range of 515 nm to 535 nm.

The following describes details of constituents of the light-emitting device 100.

Light-Emitting Element

The first light-emitting elements 10b, the second light-emitting element 20g, and the third light-emitting element 30g may be disposed in appropriately selected arrangement. The following exemplifies several preferable arrangements.

As shown in FIG. 1A and FIG. 1B, the longitudinal directions of the first light-emitting element 10b and the second light-emitting element 20g may be parallel to the longitudinal direction (i.e., lateral direction in FIG. 1A and FIG. 1B) of the support 7. In addition or alternatively, as shown in FIG. 1A and FIG. 1B, the longitudinal direction of the first light-emitting element 10b may be aligned with the longitudinal direction of the second light-emitting element 20g in one straight line. These arrangements can distribute light emitted from the light-emitting elements more uniformly over the entire light-emitting device 100.

The element-mounting surface of the support 7 herein is a surface of the support 7 on which at least one of the first light-emitting element 10b and the second light-emitting element 20g is mounted. The same applies to the arrangement of the first light-emitting element 10b and the third light-emitting element 30g.

As in the case of the light-emitting device 100 where the two first light-emitting elements 10b, the second light-emitting element 20g, and the third light-emitting element 30g are used, blue light-emitting elements and green light-emitting elements may be alternately disposed as shown in FIG. 1A. That is, the light-emitting element nearest (for example, the distance between the centers of the light-emitting elements is the shortest) to the first light-emitting element 10b in the second row from the bottom is the second light-emitting element 20g, and the light-emitting element nearest to the first light-emitting element 10b in the bottom row is the third light-emitting element 30g. As shown in FIG. 1A, the two first light-emitting elements 10b, the second light-emitting element 20g, and the third light-emitting element 30g are arranged in a two-dimensional array. As shown in FIG. 1A, the two first light-emitting elements 10b are located diagonally in one diagonal line connecting the centers of the light-emitting elements, and the second light-emitting element 20g and the third light-emitting element 30g are located diagonally in another diagonal line other than the aforementioned diagonal line. Such an arrangement can reduce color non-uniformity.

As shown in FIG. 1A, a plurality of rows may be disposed in each of which the longitudinal direction of a blue light-emitting element is aligned with the longitudinal direction of a green light-emitting element in one straight line. That is, the longitudinal direction of one first light-emitting element 10b may be aligned with the longitudinal direction of the second light-emitting element 20g in one straight line, and the longitudinal direction of the other first light-emitting element 10b may be aligned with the longitudinal direction of the third light-emitting element 30g in another straight line.

The above preferable arrangements may be appropriately altered.

The first light-emitting elements 10b, the second light-emitting element 20g, the third light-emitting element 30g, and the fourth light-emitting element may be semiconductor elements such as light-emitting diodes (LEDs) that emit light from itself by applying a voltage. For the semiconductor used for each of the light-emitting elements, nitride based semiconductors ($In_XAl_YGa_{1-X-Y}N$, $0 \leq X$, $0 \leq Y$, $X+Y \leq 1$) can be used. That is, the first light-emitting elements 10b, the second light-emitting element 20g, the third light-emitting element 30g, and the fourth light-emitting element may be nitride semiconductor elements. The number of each of the first light-emitting elements 10b, the second light-emitting element 20g, the third light-emitting element 30g, and the fourth light-emitting element disposed on the support 7 may be one or or more. The planar shape of each light-emitting element may be a substantially square or a substantially rectangle, or a plurality of light-emitting elements having different shapes may be disposed in combination. The numbers and the shapes of the light-emitting elements can be selected as appropriate depending on the shape and the size of the support 7.

The light output of the first light-emitting element 10b may be the same as the light output of the second light-emitting element 20g or the third light-emitting element 30g. Alternatively, the light output of the first light-emitting element 10b may differ from the light output of the second light-emitting element 20g or the third light-emitting element 30g depending on the desired properties such as color reproducibility. As one embodiment for providing good color reproducibility, the ratio of the light output of the second light-emitting element 20g or the third light-emitting element 30g to the light output of the first light-emitting element 10b may be about 0.3 or more and about 0.7 or less.

The ratio of the light outputs of the light-emitting elements can be calculated from the ratio of the heights of the emission peaks of the blue light-emitting element and the green light-emitting element after obtaining emission spectra with a spectrophotometer.

In the embodiment shown in FIG. 1B, the upper surface of the first light-emitting element 10b is located at the same height as the upper surface of the second light-emitting element 20g, but these heights can be altered as appropriate. The upper surface of the second light-emitting element 20g may be located higher than the upper surface of the first light-emitting element 10b. That is, the upper surface of the second light-emitting element 20g may be located nearer to the light extracting surface (i.e., upper surface of the light-transmissive member 3) of the light-emitting device 100 than the upper surface of the first light-emitting element 10b is. For example, the second light-emitting element 20g can be disposed on a submount so that the upper surface of the second light-emitting element 20g is higher than the upper surface of the first light-emitting element 10b on the support 7. Alternatively, one or more steps can be made on the element-mounting surface of the support 7 between the first light-emitting element 10b and the second light-emitting element 20g. These methods can be used in combination. The same applies to the third light-emitting element 30g. Such arrangements enable good color reproducibility to be obtained, for example, even when the light outputs of the second light-emitting element 20g and the third light-emitting element 30g are rather lower than the light output of the first light-emitting element 10b.

Light-Transmissive Member

The light-transmissive member 3 may be formed of resins, glass materials or other materials by appropriately selecting. When the light-transmissive member 3 is formed of a resin, suitable resin may be used. One of preferable examples is a transparent resin, because absorption of light emitted from the first light-emitting elements 10b, the second light-emitting element 20g, the third light-emitting element 30g, and the phosphor 4 is reduced. Another preferable example is a semitransparent resin made by containing a diffusing material such as $TiO_2$ and $SiO_2$ in a transparent resin. This is because absorption of light emitted from the first light-emitting elements 10b, the second light-emitting element 20g, the third light-emitting element 30g, and the phosphor 4 can be reduced to some extent, and the light can be diffused sufficiently.

Examples of such preferable resins include silicone based resins and epoxy based resins. The light-transmissive member 3 can be formed by melting such a resin, mixing and dispersing the phosphor 4, then providing the resin containing the dispersed phosphor 4 in the cavity of the resin package 2, and curing the resin.

Support

The resin package 2, which is one embodiment of the support 7, may be formed of suitable resin. Examples of preferable resins include nylon based resins, epoxy based resins, and silicone based resins.

For example, a reflective material may be disposed by plating with a metal such as silver (Ag) on the surface of the cavity of the resin package 2, or the surface of the cavity may have a light color such as white as appropriate. These constitutions can improve light reflectance of the surface of the cavity. Since light reached the surface of the cavity is reflected toward the emission direction in larger mount, the efficiency of the light-emitting device 100 can be enhanced.

Instead of the resin package having the cavity, for example, the support can include an insulating substrate made of a ceramic, a resin, a dielectric body, glass, or a composite material thereof, and connection terminals disposed on the surface of the substrate. Mounting the first light-emitting elements 10b, the second light-emitting element 20g, and the third light-emitting element 30g on the support, thereafter the light-transmissive member 3 containing the phosphor 4 may be formed to cover the first light-emitting elements 10b, the second light-emitting element 20g, and the third light-emitting element 30g, for example, by molding.

Figure 3:
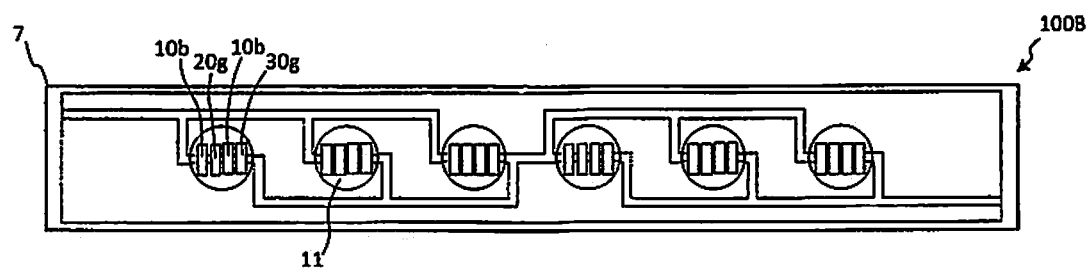
FIG. 3 is a schematic top view of a modification of a light-emitting device 100B according to the first embodiment.

A long flexible member may be used for the support as shown in FIG. 3. A light-emitting device 100B shown in FIG. 3 includes the support 7, the first light-emitting elements 10b, the second light-emitting elements 20g, the third light-emitting elements 30g, and a plurality of encapsulants 11.

A flexible insulating material constitutes the support 7 shown in FIG. 3. As such a material, an insulating resin such as polyethylene terephthalate and polyimides can be preferably used, but other materials can be appropriately selected. For example, the support 7 may be constituted by covering a sheet of long and thin, tape-shaped copper foil or aluminum foil with an insulating resin. The thickness of the support 7 can be, for example, in a range of about 10 μm to about 100 μm. The ratio of the lengths of the support 7 in the longitudinal direction and the short direction can be selected as appropriate, and can be, for example, 6:1, 30:1, or 100:1. The length of the support 7 in the longitudinal direction can be, for example, about 1150 mm. The length of the support 7 in the short direction can be about 15 mm.

On the support 7, each of the encapsulants 11 covers the first light-emitting elements 10b, the second light-emitting elements 20g, and the third light-emitting elements 30g. In the present embodiment, the encapsulants 11 are aligned in a row along a first direction. The encapsulants 11 have a hemispherical shape in the present embodiment, but the shape can be appropriately selected. A light-transmissive resin (such as an epoxy resin, a urea resin, and a silicone resin) constitutes the encapsulants 11. The encapsulants 11 may contain a light-scattering material (such as barium sulfate, titanium oxide, aluminum oxide, and silicon oxide). The encapsulants 11 contain a wavelength conversion member such as a phosphor.

The first light-emitting elements 10b, the second light-emitting element 20g, and the third light-emitting element 30g are disposed on the support 7. In each of the light-emitting devices in the light-emitting device 100B shown in FIG. 3, blue light-emitting elements and green light-emitting elements are alternately disposed. Specifically, one of the first light-emitting elements 10b, the second light-emitting element 20g, another one of the first light-emitting elements 10b, and the third light-emitting element 30g are disposed in this order along the longitudinal direction of the light-emitting device 100B. Such an arrangement can suppress color non-uniformity. For the method for mounting each light-emitting element, die bonding and wire bonding may be employed as well as flip chip mounting. An underfill material is preferably provided between each light-emitting element and the support 7. For example, a silicone resin or an epoxy resin constitutes the underfill material. The underfill material is preferably light-reflective. Specifically, the underfill material preferably contains a white substance such as titanium oxide and silicon oxide.

Figure 4A:
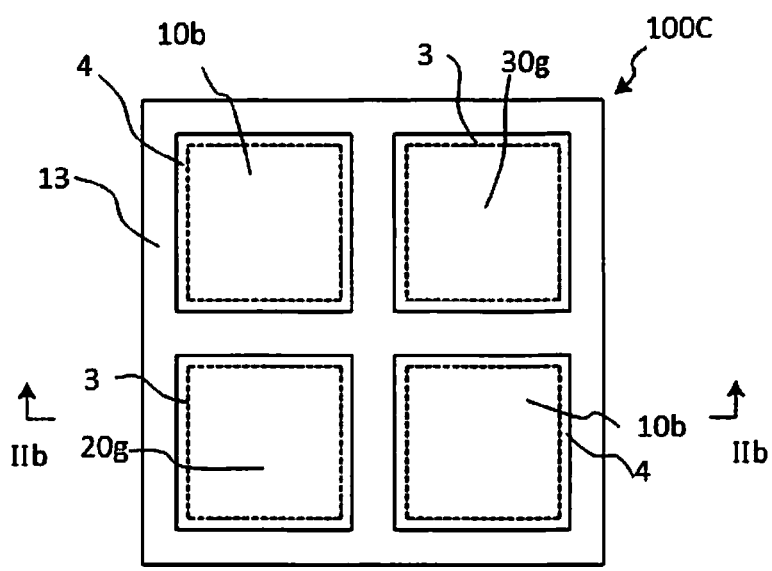
FIG. 4A is a schematic top view of a modification of a light-emitting device 100C according to the first embodiment.
Figure 4B:
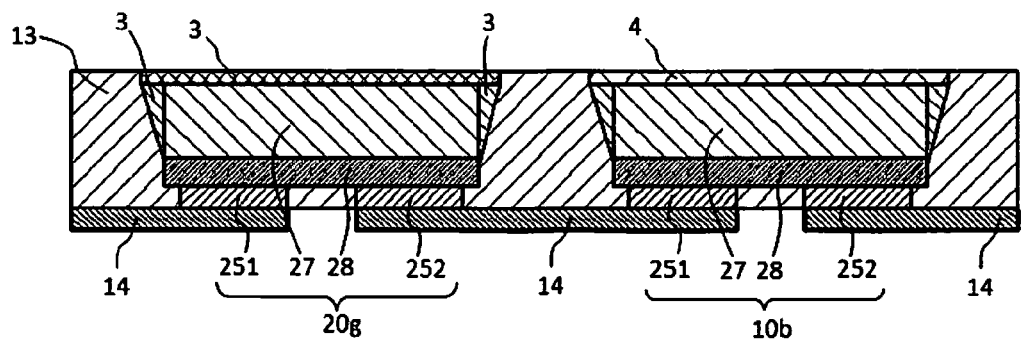
FIG. 4B is a schematic cross-sectional view along the line in FIG. 4A.

A light-emitting unit 100C shown in FIG. 4A and FIG. 4B can be exemplified as a modification of the light-emitting unit 100 without the support. The light-emitting unit 100C shown in FIG. 4A and FIG. 4B includes the first light-emitting elements 10b, the second light-emitting element 20g, the third light-emitting element 30g, the light-transmissive member 3 disposed on the lateral sides of each light-emitting element, and a covering member 13 covering the outer surfaces of the light-transmissive member 3. The light-emitting unit 100C can include the phosphor 4 and the light-transmissive member 3 on its upper side, which functions as the light-emitting surface.

The first light-emitting element 10b shown in FIG. 4B includes a light-transmissive substrate 27, a semiconductor stacked body 28, and a pair of electrodes 251 and 252. The light-transmissive substrate 27 is disposed on the upper side of the first light-emitting element 10b, and the semiconductor stacked body 28 is disposed on the lower side of the first light-emitting element 10b.

The pair of electrodes 251 and 252 of the first light-emitting element 10b are exposed on the lower surface of the light-emitting unit 100C out of the covering member 13. The same applies to the second light-emitting element 20g and the third light-emitting element 30g. The covering member 13 covers the outer surfaces of the light-transmissive member 3 disposed on the lateral surfaces of each light-emitting element, and exposed portions of the lateral surfaces of each light-emitting element. The covering member 13 is formed of a material that satisfies a predetermined relation of the covering member 13 to the light-transmissive member 3 and each light-emitting element in terms of magnitude of coefficients of thermal expansion. Specifically, a difference in the coefficients of thermal expansion between the light-transmissive member 3 and each light-emitting element is referred to as a "first difference ΔT30 in coefficients of thermal expansion", and a difference in coefficients of thermal expansion between the covering member 13 and each light-emitting element is referred to as a "second difference ΔT40 in coefficients of thermal expansion". The material of the covering member 13 is selected so that the relation ΔT40<ΔT30 is satisfied. This constitution can alleviate detachment of the light-transmissive member 3 from each light-emitting element.

In particular, the resin material used for the covering member 13 is preferably a light-transmissive thermosetting resin such as a silicone resin, a modified silicone resin, an epoxy resin, and a phenolic resin. The covering member 13 can be formed of a light-reflective resin. The light-reflective resin herein is a resin material that has a reflectance for light from a light-emitting element of 70% or more. Light reached the covering member 13 is reflected toward the upper side (i.e., light-emitting surface side) of the light-emitting unit 100C, thus the light extraction efficiency of the light-emitting unit 100C can be enhanced.

The light-transmissive member 3 covers the lateral surfaces of each light-emitting element and guides light exiting from the lateral surfaces in the upper-surface direction of the light-emitting unit 100C. In other words, the light-transmissive member 3 is intended to extract light out of the light-emitting element through the light-transmissive member 3 before the light is attenuated within each light-emitting element due to reflection of the light that has reached the lateral surfaces of the light-emitting element, by the lateral surfaces. Any of the members exemplified in the description of the light-emitting unit 100 can be used for the light-transmissive member 3. In particular, the member is preferably a light-transmissive thermosetting resin such as a silicone resin, a modified silicone resin, an epoxy resin, and a phenolic resin. The light-transmissive member 3 is in contact with the lateral surfaces of the light-emitting element and easily affected by heat generated by the light-emitting element while the light-emitting element is lighting up. Thermosetting resins are suitable for the light-transmissive member 3 because this kind of resin is good heat resistant property. The light-transmissive member 3 preferably has a high transmittance of light. Thus, it is usually preferable that the light-transmissive member 3 contain substantially no additives that reflect, absorb, or scatter light. In some cases, however, it is preferable to add an additive to the light-transmissive member 3 in order to impart desirable properties. For example, some kinds of fillers can be added to adjust the refractive index of the light-transmissive member 3 or to adjust the viscosity of the light-transmissive member before being cured.

In the light-emitting unit 100C shown in FIG. 4B, the light-transmissive member 3 is disposed on the upper side, which functions as the light-emitting surface, of the second light-emitting element 20g, and the phosphor 4 is disposed on the upper side, which functions as the light-emitting surface, of the first light-emitting element 10b. It is preferable that the light-transmissive member 3 disposed on the upper side of the second light-emitting element 20g contain substantially no additives that reflect, absorb, or scatter light emitted from the second light-emitting element 20g. Such an arrangement enables beams of light emitted from the first light-emitting elements 10b, the second light-emitting element 20g, the third light-emitting element 30g, and the phosphor 4 to be mixed with one another and enables a desired color light such as white light to be obtained. As shown in FIG. 4B, the first light-emitting element 10b is connected to the second light-emitting element 20g in series via a metal film 14 formed by sputtering or the like. Disposing the metal film 14 enables heat from the light-emitting elements to be efficiently dissipated to the outside.

The light-emitting unit 100 may be manufactured by the following manufacturing method.

After locating the first lead 36a and the second lead 36b in a mold, a resin is provided in the mold, so that the resin package 2, the first lead 36a, and the second lead 36b are integrally formed. The first light-emitting elements 10b are disposed on a portion of the first lead 36a exposed on the bottom surface of the cavity of the resin package 2. The second light-emitting element 20g and the third light-emitting element 30g are disposed on a portion of the first lead 36a exposed on the bottom surface of the cavity of the resin package 2. After that, the wires 6 are used to connect the lead 36a, the first light-emitting elements 10b, the second light-emitting element 20g, the third light-emitting element 30g, and the second lead 36b.

Subsequently, a molten resin containing the phosphor 4 is charged into the cavity of the resin package 2 so that at least part of the resin is in contact with the first light-emitting elements 10b, the second light-emitting element 20g, and the third light-emitting element 30g. The phosphor 4 is allowed to settle down, and then the resin is cured to form the light transmissive member 3.

The light-emitting unit 100 described above is so-called a top-view light-emitting device in which the upper surface of the light-emitting device serves as the light extracting surface and the lower surface serves as the element-mounting surface. The term "light-emitting device" according to an embodiment of the present disclosure includes so-called a side-view light-emitting device in which a surface adjacent to the light extracting surface is the element-mounting surface, and light is emitted in a direction substantially parallel to the device-mounting surface.

2. Second Embodiment

Figure 5:
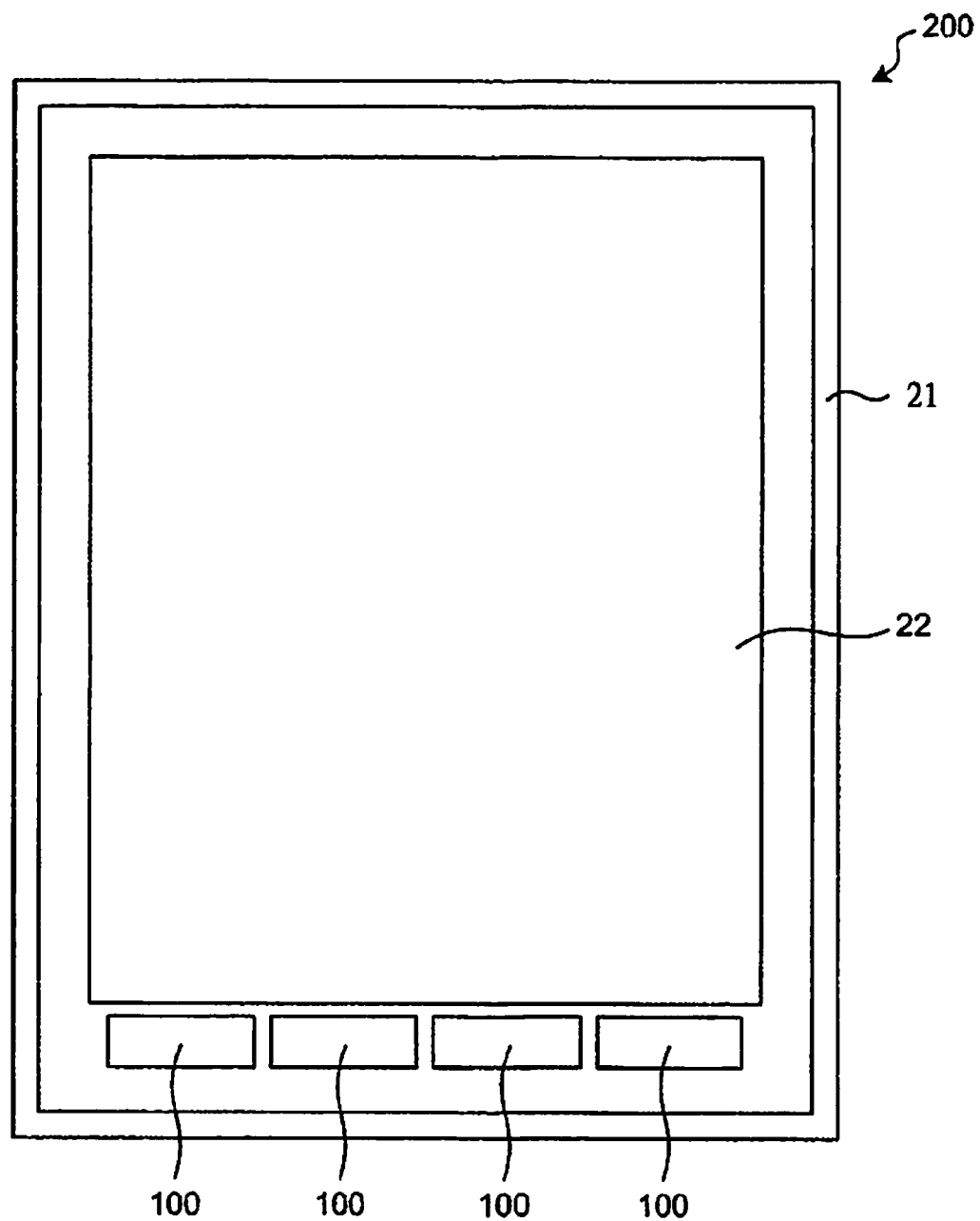
FIG. 5 is a schematic top view of a backlight 200 according to a second embodiment.

FIG. 5 is a schematic top view of a backlight 200 according to a second embodiment. The backlight 200 includes the light-emitting device 100 as described below. The light-emitting device 100 in the following description, however, may be replaced with the light-emitting device 100A, 100B or 100C.

The backlight 200 includes a case 21, a light guide plate 22 in the case 21, and the light-emitting device 100 that is disposed in the case 21 and emits light toward the light guide plate 22. In the backlight 200, light emitted from the light-emitting device 100 to a desired apparatus such as a liquid-crystal panel, through the light guide plate 22.

The case 21 may be formed so that its inner surfaces reflect light. For example, the inner surfaces may be white color.

At least one of the four lateral surfaces of the light guide plate 22 is used as the incident surface (i.e., light incident portion) of light. In the embodiment shown in FIG. 5, the lower side surface is the incident surface. The light-emitting device 100 is disposed so that its light extracting surface faces the incident surface. It is preferable that a plurality of light-emitting devices 100 be disposed along the incident surface. Light emitted from the light-emitting device 100 enters the light guide plate 22 through the incident surface. When a plurality of light-emitting devices 100 are used, beams of light emitted from the different light-emitting devices 100 are mixed with one another within the light guide plate 22.

The upper surface of the light guide plate 22 serves as the light emission surface. By disposing a desired apparatus such as a liquid-crystal panel on the light emission surface, light exiting from the light guide plate 22 travels toward the apparatus.

The longitudinal direction of the light extracting surface of the light-emitting device 100 may be aligned with the longitudinal direction of the incident portion (incident surface) of the light guide plate 22. The longitudinal direction of the light extracting surface of the light-emitting device 100 is parallel to the longitudinal direction of the incident surface of the light guide plate, and thus light from the light-emitting device 100 can be more efficiently guided into the light guide plate 22.

Figure 6:
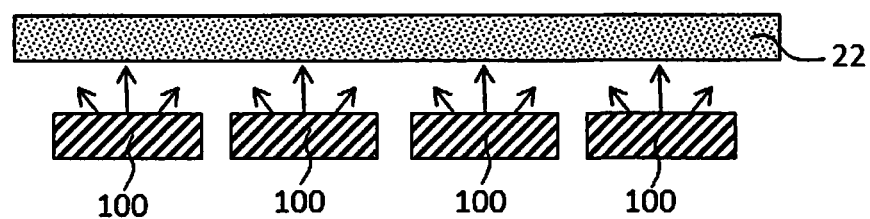
FIG. 6 is a schematic cross-sectional view of a modification of the backlight 200 according to the second embodiment.

FIG. 6 is a schematic cross-sectional view of a modification of the backlight 200 according to the second embodiment. As shown in FIG. 6, the backlight 200 may be so-called a direct-lit backlight apparatus in which a plurality of light-emitting devices 100 are disposed directly below the light guide plate 22.

The light-emitting device according to an embodiment of the present disclosure can be used for a backlight for a liquid-crystal display, for example.

The invention claimed is:

1. A light-emitting device comprising:
at least two first light-emitting elements each having a peak wavelength in a range from 430 nm to less than 490 nm;
at least one second light-emitting element having a peak wavelength Y in a range from 490 nm to less than a wavelength X;
at least one third light-emitting element having a peak wavelength Z in a range from more than the wavelength X to 570 nm; and
a phosphor having a composition represented by $A_2MF_6$:$Mn^{4+}$, wherein A is at least one selected from the group consisting of K, Li, Na, Rb, Cs, and NH.sub.4.sup.+, and M is at least one element selected from the group consisting of Group IV elements and Group XIV elements,
wherein at least one of the second light-emitting element and the third light-emitting element is connected to at least one of the first light-emitting elements in series,
the wavelength X is in a range from more than 490 nm to less than 570 nm with an absolute value of difference between |X−Y| and |X−Z| being 10 nm or less,
a number of the first light-emitting elements is equal to a total number of the second light-emitting element and the third light-emitting element, and
a ratio of a total light output of the second light-emitting element and the third light-emitting element to a total light output of the first light-emitting elements is in a range from 0.3 to 0.7 about 0.3 or more and about 0.7 or less.

2. The light-emitting device according to claim 1, further comprising
the number of the one or more first light-emitting elements is two, wherein the first light-emitting elements, the second light-emitting element, and the third light-emitting element are arranged in a two-dimensional array,
the first light-emitting elements are arranged diagonally with respect to each other along a first diagonal line connecting centers of the first light-emitting elements, and
the second light-emitting element and the third light-emitting element are arranged diagonally with respect to each other along a second diagonal line other than the first diagonal line.

3. The light-emitting device according to claim 1, wherein the wavelength X is in a range from 515 nm to 535 nm.

4. The light-emitting device according to claim 1, further comprising
a support on which the first light-emitting elements, the second light-emitting element, and the third light-emitting element are disposed.

5. The light-emitting device according to claim 1, wherein the phosphor is contained in a light-transmissive member covering the first light-emitting elements, the second light-emitting element, and the third light-emitting element.

6. A backlight comprising:
the light-emitting device according to claim 1; and
a light guide plate having a lateral surface including an incident portion of light, the light guide plate being arranged with respect to the light-emitting device so that the incident portion faces a light extracting surface of the light-emitting device.

7. The light-emitting device according to claim 1, wherein the number of the first light-emitting elements is 2, and the total number of the second-light emitting element and the third light-emitting element is 2.

* * * * *